US008125065B2

(12) United States Patent
Lee

(10) Patent No.: US 8,125,065 B2
(45) Date of Patent: *Feb. 28, 2012

(54) ELIMINATION OF RDL USING TAPE BASE FLIP CHIP ON FLEX FOR DIE STACKING

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 451 days.

This patent is subject to a terminal disclaimer.

(21) Appl. No.: 11/714,072

(22) Filed: Mar. 5, 2007

(65) Prior Publication Data

US 2008/0074852 A1  Mar. 27, 2008

Related U.S. Application Data

(60) Continuation of application No. 10/853,377, filed on May 25, 2004, now Pat. No. 7,189,593, which is a division of application No. 10/050,507, filed on Jan. 16, 2002, now Pat. No. 7,129,584.

(30) Foreign Application Priority Data

Jan. 9, 2002  (SG) ............................... 200200130-3

(51) Int. Cl.
  *H01L 23/02* (2006.01)

(52) U.S. Cl. ........ 257/686; 257/685; 257/698; 257/723; 257/737; 257/738; 257/773; 257/774; 257/777; 257/778

(58) Field of Classification Search .................. 257/685, 257/686, 698, 723, 737, 738, 773, 774, 777, 257/778
See application file for complete search history.

(56) References Cited

U.S. PATENT DOCUMENTS

| | | | |
|---|---|---|---|
| 3,239,496 | A | 3/1966 | Jursich |
| 4,074,342 | A | 2/1978 | Honn |
| 4,415,403 | A | 11/1983 | Bakewell |
| 4,807,021 | A | 2/1989 | Okumura |
| 4,818,728 | A | 4/1989 | Rai |
| 4,954,875 | A | 9/1990 | Clements |
| 5,148,265 | A | 9/1992 | Khandros |
| 5,346,861 | A | 9/1994 | Khandros |
| 5,347,159 | A | 9/1994 | Khandros |
| 5,366,794 | A | 11/1994 | Nakao |
| 5,385,869 | A | 1/1995 | Liu |
| 5,386,341 | A | 1/1995 | Olson |
| 5,397,921 | A | 3/1995 | Karnezos |

(Continued)

FOREIGN PATENT DOCUMENTS

EP  0475022  3/1992

(Continued)

OTHER PUBLICATIONS

Australian Search Report dated Aug. 11, 2004.

(Continued)

*Primary Examiner* — Kevin M Picardat
*Assistant Examiner* — Bac Au
(74) *Attorney, Agent, or Firm* — Whyte Hirschboeck Dudek SC

(57) ABSTRACT

A flexible film interposer for stacking a flip chip semiconductor die onto a second (bottom) semiconductor die, semiconductor devices and stacked die assemblies that incorporate the flexible film interposer, and methods of fabricating the devices and assemblies are provided. The incorporation of the flexible film interposer achieves densely packaged semiconductor devices, without the need for a redistribution layer (RDL).

33 Claims, 10 Drawing Sheets

U.S. PATENT DOCUMENTS

| | | |
|---|---|---|
| 5,404,044 A | 4/1995 | Booth |
| 5,409,865 A | 4/1995 | Karnezos |
| 5,422,205 A | 6/1995 | Inoue |
| 5,438,477 A | 8/1995 | Pasch |
| 5,448,511 A | 9/1995 | Paurus |
| 5,468,681 A | 11/1995 | Pasch |
| 5,468,995 A | 11/1995 | Higgins, III |
| 5,489,804 A | 2/1996 | Pasch |
| 5,504,277 A | 4/1996 | Danner |
| 5,598,033 A | 1/1997 | Behlen |
| 5,608,265 A | 3/1997 | Kitano |
| 5,646,446 A | 7/1997 | Nicewarner |
| 5,663,530 A | 9/1997 | Schueller |
| 5,668,405 A | 9/1997 | Yamashita |
| 5,674,785 A | 10/1997 | Akram |
| 5,679,977 A | 10/1997 | Khandros |
| 5,683,942 A | 11/1997 | Kata |
| 5,697,148 A | 12/1997 | Lance, Jr. |
| 5,702,662 A | 12/1997 | Smith |
| 5,710,071 A | 1/1998 | Beddingfield |
| 5,719,449 A | 2/1998 | Strauss |
| 5,721,151 A | 2/1998 | Padmanabhan |
| 5,723,347 A | 3/1998 | Hirano |
| 5,739,585 A | 4/1998 | Akram |
| 5,742,100 A | 4/1998 | Schroeder |
| 5,747,982 A | 5/1998 | Dromgoole |
| 5,752,182 A | 5/1998 | Nakatsuka |
| 5,758,413 A | 6/1998 | Chong |
| 5,768,109 A | 6/1998 | Gulick |
| 5,777,391 A | 7/1998 | Nakamura |
| 5,798,285 A | 8/1998 | Bentlage |
| 5,798,567 A | 8/1998 | Kelly |
| 5,805,422 A | 9/1998 | Otake |
| 5,812,378 A | 9/1998 | Fjelstad |
| 5,818,113 A | 10/1998 | Iseki |
| 5,821,624 A | 10/1998 | Pasch |
| 5,834,338 A | 11/1998 | Takeda |
| 5,834,366 A | 11/1998 | Akram |
| 5,834,848 A | 11/1998 | Iwasaki |
| 5,835,355 A | 11/1998 | Dordi |
| 5,843,808 A | 12/1998 | Karnezos |
| 5,844,168 A | 12/1998 | Schueller |
| 5,844,315 A | 12/1998 | Melton |
| 5,866,953 A | 2/1999 | Akram |
| 5,886,408 A | 3/1999 | Ohki |
| 5,891,753 A | 4/1999 | Akram |
| 5,892,271 A | 4/1999 | Takeda |
| 5,898,224 A | 4/1999 | Akram |
| 5,905,303 A | 5/1999 | Kata |
| 5,973,389 A | 10/1999 | Culnane |
| 5,973,404 A | 10/1999 | Akram |
| 5,977,640 A | 11/1999 | Bertin |
| 5,982,030 A | 11/1999 | Macintrye |
| 5,984,691 A | 11/1999 | Brodsky |
| 5,986,460 A | 11/1999 | Kawakami |
| 5,990,545 A | 11/1999 | Schueller |
| 5,991,161 A | 11/1999 | Samaras |
| 6,005,776 A | 12/1999 | Holman |
| 6,008,543 A | 12/1999 | Iwabuchi |
| 6,011,694 A | 1/2000 | Hirakawa |
| 6,013,948 A | 1/2000 | Akram |
| 6,020,629 A | 2/2000 | Farnworth |
| 6,022,761 A | 2/2000 | Grupen-Shemansky |
| 6,024,584 A | 2/2000 | Lemke |
| 6,027,346 A | 2/2000 | Sinsheimer |
| 6,028,365 A | 2/2000 | Akram |
| 6,034,427 A | 3/2000 | Lan |
| 6,037,665 A | 3/2000 | Miyazaki |
| 6,039,889 A | 3/2000 | Zhang |
| 6,040,630 A | 3/2000 | Panchou |
| 6,048,755 A | 4/2000 | Jiang |
| 6,050,832 A | 4/2000 | Lee |
| 6,057,178 A | 5/2000 | Galuschki |
| 6,060,782 A | 5/2000 | Ohsono |
| 6,064,114 A | 5/2000 | Higgins, III |
| 6,072,233 A | 6/2000 | Corisis |
| 6,074,897 A | 6/2000 | Degani |
| 6,075,710 A | 6/2000 | Lau |
| 6,079,991 A | 6/2000 | Lemke |
| 6,093,035 A | 7/2000 | Lemke |
| 6,116,921 A | 9/2000 | Scholz |
| 6,124,631 A | 9/2000 | Cardot |
| 6,127,736 A | 10/2000 | Akram |
| 6,133,072 A | 10/2000 | Fjelstad |
| 6,133,637 A | 10/2000 | Hikita |
| 6,137,062 A | 10/2000 | Zimmerman |
| 6,137,164 A | 10/2000 | Yew et al. |
| 6,137,183 A | 10/2000 | Sako |
| 6,157,541 A | 12/2000 | Hacke |
| 6,165,885 A | 12/2000 | Gaynes |
| 6,172,422 B1 | 1/2001 | Chigawa |
| 6,177,723 B1 | 1/2001 | Eng |
| 6,179,598 B1 | 1/2001 | Brand |
| 6,180,881 B1 | 1/2001 | Isaak |
| 6,191,487 B1 | 2/2001 | Rodenbeck |
| 6,208,521 B1 | 3/2001 | Nakatsuka |
| 6,208,525 B1 | 3/2001 | Imasu |
| 6,212,768 B1 | 4/2001 | Murakami |
| 6,214,156 B1 | 4/2001 | Takano |
| 6,217,343 B1 | 4/2001 | Okuno |
| 6,218,202 B1 | 4/2001 | Yew |
| 6,219,911 B1 | 4/2001 | Estes |
| 6,221,763 B1 | 4/2001 | Gilton |
| 6,222,265 B1 | 4/2001 | Akram |
| 6,225,688 B1 | 5/2001 | Kim |
| 6,229,711 B1 | 5/2001 | Yoneda |
| 6,232,666 B1 | 5/2001 | Corisis |
| 6,239,496 B1 | 5/2001 | Asada |
| 6,242,932 B1 | 6/2001 | Hembree |
| 6,262,895 B1 | 7/2001 | Forthun |
| 6,265,775 B1 | 7/2001 | Seyyedy |
| 6,271,469 B1 | 8/2001 | Ma et al. |
| 6,281,046 B1 | 8/2001 | Lam |
| 6,285,081 B1 | 9/2001 | Jackson |
| 6,291,265 B1 | 9/2001 | Mess |
| 6,291,775 B1 | 9/2001 | Saitoh |
| 6,291,884 B1 | 9/2001 | Glenn |
| 6,294,455 B1 | 9/2001 | Ahn |
| 6,295,730 B1 | 10/2001 | Akram |
| 6,300,679 B1 | 10/2001 | Mukerji |
| 6,310,288 B1 | 10/2001 | Moden |
| 6,323,060 B1 | 11/2001 | Isaak |
| 6,338,985 B1 | 1/2002 | Greenwood |
| 6,373,268 B1 | 4/2002 | Dunlap et al. |
| 6,376,769 B1 | 4/2002 | Chung |
| 6,404,648 B1 | 6/2002 | Slupe |
| 6,407,450 B1 | 6/2002 | Verma |
| 6,413,102 B2 | 7/2002 | Jiang |
| 6,429,516 B1 | 8/2002 | Tsunoi |
| 6,432,737 B1 | 8/2002 | Webster |
| 6,452,807 B1 | 9/2002 | Barrett |
| 6,468,831 B2 | 10/2002 | Leong |
| 6,482,676 B2 | 11/2002 | Tsunoi |
| 6,489,676 B2 | 12/2002 | Taniguchi |
| 6,489,687 B1 | 12/2002 | Hashimoto |
| 6,492,737 B1 | 12/2002 | Imasu |
| 6,515,324 B2 | 2/2003 | Shibuya |
| 6,518,677 B1 | 2/2003 | Capote |
| 6,534,853 B2 | 3/2003 | Liu |
| 6,552,910 B1 | 4/2003 | Moon |
| 6,563,223 B2 | 5/2003 | Freeman |
| 6,586,830 B2 | 7/2003 | Saito |
| 6,600,222 B1 | 7/2003 | Levardo |
| 6,610,559 B2 | 8/2003 | Wang |
| 6,624,060 B2 | 9/2003 | Chen |
| 6,634,100 B2 | 10/2003 | Akram |
| 6,714,418 B2 | 3/2004 | Frankowsky |
| 6,730,855 B2 | 5/2004 | Bando |
| 6,744,122 B1 | 6/2004 | Hashimoto |
| 6,756,251 B2 | 6/2004 | Lee |
| 6,791,195 B2 | 9/2004 | Urushima |
| 6,847,105 B2 | 1/2005 | Koopmans |
| 2001/0048157 A1 | 12/2001 | Murtuza |
| 2001/0053563 A1 | 12/2001 | Kim et al. |
| 2002/0027080 A1 | 3/2002 | Yoshioka |
| 2002/0045611 A1 | 4/2002 | Abrams |
| 2002/0079594 A1 | 6/2002 | Sakurai |

| | | | |
|---|---|---|---|
| 2002/0127769 A1 | 9/2002 | Ma et al. | |
| 2002/0142513 A1 | 10/2002 | Fee | |
| 2002/0167092 A1 | 11/2002 | Fee | |
| 2002/0185661 A1 | 12/2002 | Kawanobe | |
| 2003/0012930 A1 | 1/2003 | Brousseau, III | |
| 2003/0042595 A1 | 3/2003 | Canella | |
| 2003/0134450 A1 | 7/2003 | Lee | |
| 2004/0026773 A1 | 2/2004 | Koon | |
| 2004/0212055 A1 | 10/2004 | Exposito | |
| 2004/0217454 A1 | 11/2004 | Brechignav | |

FOREIGN PATENT DOCUMENTS

| | | |
|---|---|---|
| EP | 684644 | 11/1995 |
| EP | 0997942 | 5/2000 |
| EP | 1009027 A3 | 5/2003 |
| JP | 4030456 | 2/1992 |
| JP | 2000-183082 | 6/2000 |
| JP | 2000-230964 | 8/2000 |
| JP | 2001-077294 | 3/2001 |
| KR | 2001-054744 | 7/2001 |
| WO | 99/65282 | 12/1999 |

OTHER PUBLICATIONS

Australian Search Report dated Aug. 16, 2004.

Australian Search Report dated Nov. 3, 2004.

Australian Patent Office, Search Report, May 30, 2003, 4 pages.

Al-sarawi, S. , "A Review of 3-D Packaging Technology," Components, Packaging, and Manufacturing Technology, Part B: IEEE Transactions on Advanced Packaging, vol. 21, Issue 1, Feb. 1998, pp. 2-14.

Andros, F. , "TBGA Package Technology," Components, Packaging, and Manufacturing Technology, Part B: IEEE Transactions on Advanced Packaging, vol. 17, Issue 4, Nov. 1994, pp. 564-568.

Clot, Ph. , "Flip-Chip on Flex for 3D Packaging," 1999. 24th IEEE/CPMT, Oct. 18-19, 1999, pp. 36-41.

Ferrando, F. , "Industrial Approach of a Flip-Chip Method Using the Stud-Bumps With a Non-Conductive Paste," Adhesive Joining and Coating Technology in Electronics Manufacturing, 2000. Proceedings. 4th International Conference on, Jun. 18-21, 2000, pp. 205-211.

Gallagher, C. , "A Fully Additive, Polymeric Process for the Fabrication and Assembly of Substrate and Component Level Packaging," The First IEEE International Symposium on Polymeric Electronics Packaging, Oct. 26-30, 1997, pp. 56-63.

Geissinger, J. , "Tape Based CSP Package Supports Fine Pitch Wirebonding," Electronics Manufacturing Technology Symposium, 2002, IEMT 2002, 27th Annual IEEE/SEMI International, Jul. 17-18, 2002, pp. 41-452.

Hatanaka, H., "Packaging Processes Using Flip Chip Bonder and Future Directions of Technology Development," Electronics Packaging Technology Conference, 2002. 4th, Dec. 10-12, 2002, pp. 434-439.

Haug, R. , "Low-Cost Direct Chip Attach: Comparison of SMD Compatible FC Soldering with Anisotropically Conductive Adhesive FC Bonding," IEEE Transactions on Electronics Packaging Manufacturing, vol. 23, No. 1, Jan 2000, pp. 12-18.

Isaak, H. , "Development of Flex Stackable Carriers" IEEE Electronic Components and Technology Conference, 2000 Proceedings 50th, May 21, 2000 May 24, 2000, Las Vegas, NV, USA, pp. 378 84, IEEE Catalog No. 00CH37070.

Kloeser, J. , "Fine Pitch Stencil Printing of Sn/Pb and Lead Free Solders for Flip Chip Technology," IEEE Transactions of CPMT—Part C, vol. 21, No. 1, 1998, pp. 41-49.

Lee, Tech Kheng , "Enhancement of Moisture Sensitivity Performance of a FBGA," Proceedings of International Symposium on Electronic Materials & Packaging, 2000, pp. 470-475.

Li, L. , "Stencil Printing Process Development for Flip Chip Interconnect," IEEE Transactions Part C: Electronics Packaging Manufacturing, vol. 23, Issue 3, Jul. 2000, pp. 165-170.

Lyons, A. , "A New Approach to Using Anisotropically Conductive Adhesives for Flip-Chip Assembly, Part A," IEEE Transactions on Components, Packaging, and Manufacturing Technology, vol. 19, Issue 1, Mar. 1996, pp. 5-11.

Teo, Y. , "Enhancing Moisture Resistance of PBGA," Electronic Components and Technology Conference, 1998. 48th IEEE, May 25-28, 1998, pp. 930-935.

Teutsch, T. et al, "Wafer Level CSP using Low Cost Electroless Redistribution Layer," Electronic Components and Technology Conference, 2000. 2000 Proceedings. 50th, May 21-24, 2000, pp. 107-113.

"The 2003 International Technology Roadmap for Semiconductors: Assembly and Packaging", pp. 1-22.

Tsui, C , "Pad Distribution Technology for Flip Chip Applications", 1998 Electronic Components and Technology Conference, pp. 1098-1102.

Xiao, G. , "Reliability Study and Failure Analysis of Fine Pitch Solder-Bumped Flip Chip on Low-Cost Flexible Substrate Without Using Stiffener," IEEE, 2002. Proceedings 52nd, May 28-31, 2002, pp. 112-118.

ELIMINATION OF RDL USING TAPE BASE FLIP CHIP ON FLEX FOR DIE STACKING

CROSS-REFERENCE TO RELATED APPLICATION

This application is a continuation of U.S. patent application Ser. No. 10/853,377, filed May 25, 2004, now U.S. Pat. No. 7,189,593, granted Mar. 13, 2007, which is a divisional of U.S. patent application Ser. No. 10/050,507, filed Jan. 16, 2002, now U.S. Pat. No. 7,129,584, granted Oct. 31, 2006.

FIELD OF THE INVENTION

This invention generally relates to assembling and packaging multiple semiconductor dies, and more particularly to a stacked multiple die device and methods for fabricating the device.

BACKGROUND OF THE INVENTION

Chip-on-board and board-on-chip (BOC) techniques are used to attach semiconductor dies to an interposer or other carrier substrate such as a printed circuit board (PCB). Attachment can be achieved through flip chip attachment, wirebonding, or tape automated bonding ("TAB").

Flip chip attachment typically utilizes ball grid array (BGA) technology. The BGA component (die) includes conductive external contacts, typically in the form of solder balls or bumps, arranged in a grid pattern on the active surface of the die, which permit the die to be flip chip mounted to an interposer or other carrier substrate (e.g., PCB).

In a flip chip attachment, the balls of the BGA component are aligned with terminals on the carrier substrate, and connected by reflowing the solder balls. The solder balls can be replaced with a conductive polymer that is cured. A dielectric underfill is then interjected between the flip chip die and the surface of the carrier substance to embed the solder balls and mechanically couple the BGA component to the carrier substrate.

Wirebonding and TAB attachment generally involve attaching a die by its backside to the surface of a carrier substrate with an appropriate adhesive (e.g., epoxy) or tape. With wirebonding, bond wires are attached to each bond pad on the die and bonded to a corresponding terminal pad on the carrier substrate (e.g., interposer). With TAB, ends of metal leads carried on a flexible insulating tape such as a polyimide, are attached to the bond pads on the die and to the terminal pads on the carrier substrate. A dielectric (e.g., silicon or epoxy) is generally used to cover the bond wires or metal tape leads to prevent damage.

High performance, low cost, increased miniaturization of components, and greater packaging density of integrated circuits have long been goals of the computer industry. One method of increasing integrated circuit density while reducing package size and height is to stack dies vertically. Different approaches to packaging have been pursued to provide stacked die devices.

One such example of a stacked die to lower wire bond loop height is depicted in FIG. 1, shown as an encapsulated package 10 comprising a flip chip mounted on a chip-on-board ("FC-on-chip"). As shown, the package 10 includes a flip chip 12 mounted via solder bumps 13 with the active surface 16 facing down onto the active surface 18 of a bottom die (chip-on-board) 20, which in turn, is mounted with an adhesive tape or paste 22 onto an interposer substrate 24. Bonding wires 26 connect the bond pads 28 on the bottom die 20 to lead or trace ends 30 on the interposer 24. The interposer 24 includes solder balls 32 for mounting the encapsulated package (component) 10 onto a substrate, e.g., motherboard, PCB (not shown).

Flip chip attachment has provided improved electrical performance and allowed greater packaging density. However, developments in ball grid array technology has produced arrays in which the balls are made smaller and with tighter pitches. As the balls become smaller and are set closer together, it poses problems for the mutual alignment of the conductive bumps 13 on the flip chip die 12 with the bond pads 28 on the bottom die 20, requiring a metal reroute or redistribution layer (RDL) 34 disposed as an intermediate layer on the surface of the bottom die 20. The RDL 34 effects an electrical interconnection (redistribution) between the bond pads 14 on the flip chip die 12 to the bond pads 28 on the bottom die 20 for die attachment and wire bonding to the substrate. If the bond pads 14 on the flip chip die 12 can be wafer bumped, for example, by stencil printing, electrolytic plating or electroless plating, an RDL on the flip chip die 12 may not be necessary, and the die 12 can be directly bonded to the bottom die 20 through an RDL 34 disposed on the surface of the bottom die 20, as schematically depicted in FIG. 1A, whereby the solder bumps/balls 13 on the flip chip die 12 contact the bond pads 35 of the RDL 34 on the bottom die 20. However, if the pitch of the bond pads 14 is tight, it may not be possible to wafer bump the bond pads 14 (e.g., by stencil printing, electrolytic plating, etc), and additional RDL processing on the flip chip die 12 itself may be required. The RDL 34 functions to provide electrical connection to accommodate the flip chip die 12 in either of these approaches.

Fabricating an FC-on-chip can also lead to high costs and process difficulties. For Example, a flip chip mounter is required to accurately align the top die 12 to the bottom die 20. Another drawback is that damage can occur to the active surface 18 of the bottom die 20 during an underfilling process onto the active surface 18, and a molding filler can fail to flow into voids between the dies if the gap is too small.

In view of these and other deficiencies in conventional methods for fabricating stacked die modules, improvements in fabrication methods are desirable.

SUMMARY OF THE INVENTION

The present invention provides a flexible film interposer for stacking a tape base flip chip onto a second (bottom) semiconductor die, and semiconductor devices and stacked die assemblies that incorporate the interposer, and methods of fabricating the devices and assemblies for increasing semiconductor device density. In particular, the present invention relates to a stacked multi-substrate device using a combination of flip chip and chip-on-board assemblies to achieve densely packaged semiconductor devices, without the need for a redistribution layer (RDL).

In one aspect, the invention provides a flexible film interposer structured for mounting thereon first and second semiconductor die in a stacked die assembly. In one embodiment, the flexible film interposer comprises a flexible substrate comprising a first surface, a second surface, and opposing sides; a plurality of spaced apart recesses having a base and extending through the flexible substrate for receiving conductive connecting members of a first semiconductor die therein; at least one slot formed through the substrate and disposed between the recesses and a side of the substrate; and a plurality of conductive traces disposed on the second surface of the substrate, each trace extending over the slot and at least one recess, each of the recesses having a trace disposed at the base thereof.

In another embodiment, the flexible film interposer comprises a flexible substrate comprising a first surface, a second surface, and opposing sides. The first surface of the substrate is structured for mounting thereon a first semiconductor die having a plurality of spaced apart conductive connecting members disposed on an active surface, and the second surface is structured for mounting thereon a second semiconductor die having a plurality of bond pads spaced along a periphery. The substrate comprises a plurality of spaced apart recesses having a base and extending through the substrate for receiving the plurality of conductive connecting members of the first semiconductor die therein. The substrate further comprises one or more slots extending therethrough and along a periphery of the substrate, wherein when the second semiconductor die is mounted onto the second surface of the substrate the bonding pads are exposed through the slots. The flexible film interposer can further comprise a plurality of conductive traces disposed on the second surface of the substrate, each trace extending over the slot and at least one recess, each of the recesses having a trace disposed at the base thereof.

The flexible film interposer preferably comprises a flexible polyimide film (e.g., a flex tape), having a thickness in the range of about 12.5 μm to about 200 μm. The slots are sized and configured to receive a bonding tool therethrough to contact bond pads of a semiconductor die mounted on the second surface of the interposer and exposed through the slots. An adhesive element such as a double-sided adhesive tape, can be disposed on the first and/or the second surface of the substrate to adhere the semiconductor die thereto.

In another aspect, the invention provides a semiconductor device. In one embodiment, the semiconductor device comprises a flexible film interposer according to the invention and a first semiconductor die mounted thereon, the die having a first active surface and a second surface, and the active surface comprising a plurality of spaced apart conductive connecting members. The first semiconductor die is mounted on the flexible film interposer such that a conductive connecting member of the die is received in a recess of the interposer in conductive contact with the trace at the base of the recess, and the slots on the first surface of the substrate are exposed. An underfill encapsulation material can be disposed between the active surface of the first semiconductor die and the first surface of the flexible film interposer. The semiconductor device can further include an adhesive element such as an adhesive paste or tape, disposed between the active surface of the semiconductor die and the flexible film interposer.

In another aspect, the invention provides a stacked die assembly. In one embodiment, the assembly comprises a flexible film interposer according to the invention having first and second semiconductor dies mounted on the first and second surfaces, respectively, of a flexible substrate. The first semiconductor die is mounted onto the first surface of the flexible film interposer using a conventional die attacher or a flip chip attacher such that each of a plurality of conductive connecting members of the die is received in each of a plurality of spaced apart recesses of the interposer in conductive contact with a trace at the base of the recess. The first (active) surface of the second semiconductor die is mounted onto the second surface of the flexible film interposer with bond pads on the active surface of the die exposed through the slot(s) of the flexible film interposer. An interposer substrate comprising terminal pads on a first surface, is mounted onto the second surface of the second semiconductor die with the terminal pads exposed. The traces exposed through the slots of the flexible film interposer and the underlying bond pads of the second semiconductor die are bonded to the terminal pads of the interposer substrate, for example, by wire bonding or TAB bonding. An underfill encapsulation material can be disposed between the active surface of the first semiconductor die and the first surface of the flexible film interposer. The interposer substrate can comprise a flexible material such as a polyimide substrate, or a non-flexible substrate such as bismaleimide triazine (BT) resin, FR4 fiberglass laminate, FR5 laminate, or ceramic. The interposer substrate can also comprise external contacts such as conductive solder balls, to form the stacked die assembly as a component that can be coupled to an external circuitry such as a testing apparatus. In another embodiment, the interposer substrate can comprise, for example, a PCB substrate, or a motherboard. The stacked die assembly can also be encapsulated to form a package.

In yet another aspect, the invention provides a semiconductor package. In one embodiment, the package comprises an encapsulated stacked die assembly, which comprises first and second semiconductor dies mounted on a flexible film interposer according to the invention, with the second (bottom) die being mounted on an interposer substrate.

In a further aspect, the invention provides a method of fabricating a semiconductor device. In one embodiment, the method comprises the steps of: providing a flexible film interposer, the interposer comprising a first surface and a second surface, at least one elongate slot formed through and along a peripheral edge of the interposer to expose bond pads on a second semiconductor die mounted onto the second surface of the interposer, a plurality of spaced recesses formed through the interposer and adjacent the slot, each recess having a base, and a plurality of conductive traces disposed on the second surface of the interposer, each trace extending across and exposed through the slot and the base of one or more adjacent recesses in a perpendicular orientation to the slot; and mounting a first semiconductor die on the first surface of the flexible film interposer, the first semiconductor die having an active surface comprising a plurality of spaced conductive connecting members, and mounted on the interposer such that a conductive connecting member of the die is received in a recess of the interposer in conductive contact with the trace at the base of the recess.

In another aspect, the invention provides a method of fabricating a stacked die assembly. In one embodiment, the method comprises the steps of: providing a flexible film interposer, according to the invention; mounting a first semiconductor die on the first surface of the flexible film interposer, the first semiconductor die having an active surface comprising a plurality of spaced conductive connecting members, and mounted on the interposer such that a conductive connecting member of the die is received in a recess of the interposer in conductive contact with the trace at the base of the recess; mounting a second conductor die on an interposer substrate, the second semiconductor die comprising a first active surface and a second surface, the active surface comprising a bond pad, and the interposer substrate comprising a first surface with terminal pads disposed thereon, and mounted onto the second surface of the second semiconductor die with the terminal pads exposed; mounting the second semiconductor die onto the second surface of the flexible film interposer with the bond pads of the second die exposed through the slot of the interposer; and bonding the traces of the flexible film interposer and the bond pads of the second semiconductor die to the terminal pads of the interposer substrate. Either or both of the steps of mounting the first and second semiconductor die on the flexible film interposer can further comprise applying an adhesive element to the surface of the flexible film interposer and/or the surface of the die. The step of bonding can comprise forming contacts in the slots of the flexible film interposer and over the traces and the bond pads of the second semiconductor die, and extending bonding wires from the solder ball contacts to the terminal pads on the interposer substrate. The method can further comprise the step of encapsulating the stacked die assembly to form a semiconductor package.

The invention advantageously improves the interconnection between a die component and a carrier substrate such as an interposer or PCB, and eliminate the need for a metal re-distribution layer (RDL). The invention also provides a package with a reduced total assembly height. The invention additionally eliminates problems associated with prior art underfilling and alignment processes.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating embodiments only and not for purposes of limiting the same. The figures illustrate processing steps for use in fabricating semiconductor devices in accordance with the present invention. It should be readily apparent that the processing steps are only a portion of the entire fabrication process.

The invention provides a flexible film interposer for stacking a tape base flip chip onto a second (bottom) die. Recesses are fabricated in the flexible film interposer for the first level interconnect using conventional die mount equipment. The flexible film interposer includes features to interconnect to the second die without the need for an RDL on the second die.

Figure 2:
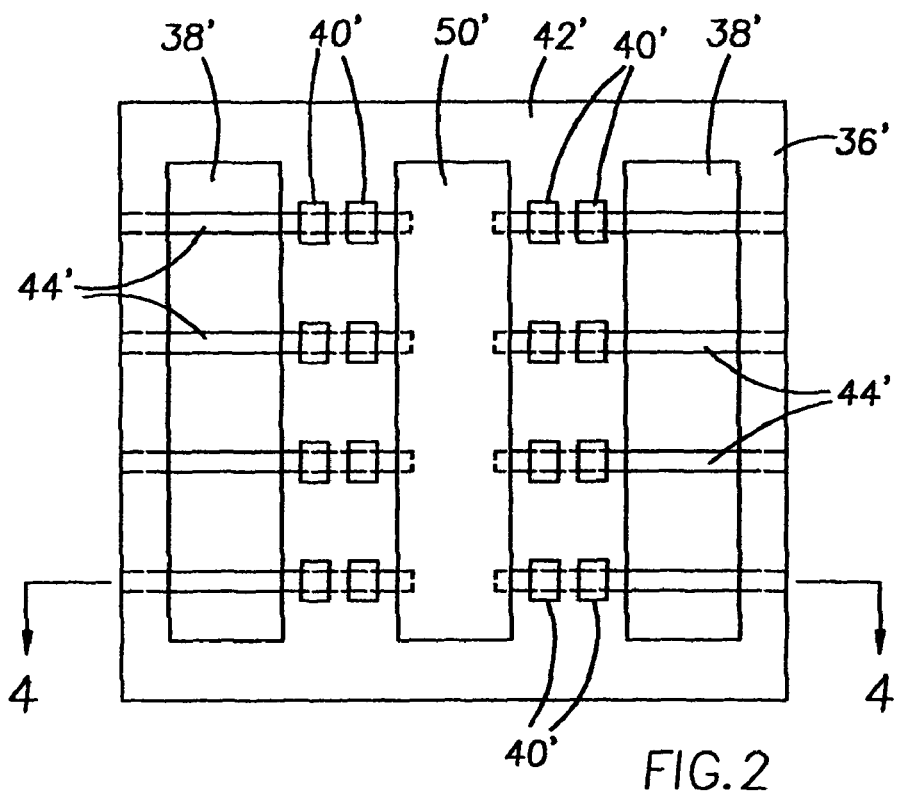
FIG. 2 is a top plan view of an embodiment of a flexible film interposer according to the invention.
Figure 3:
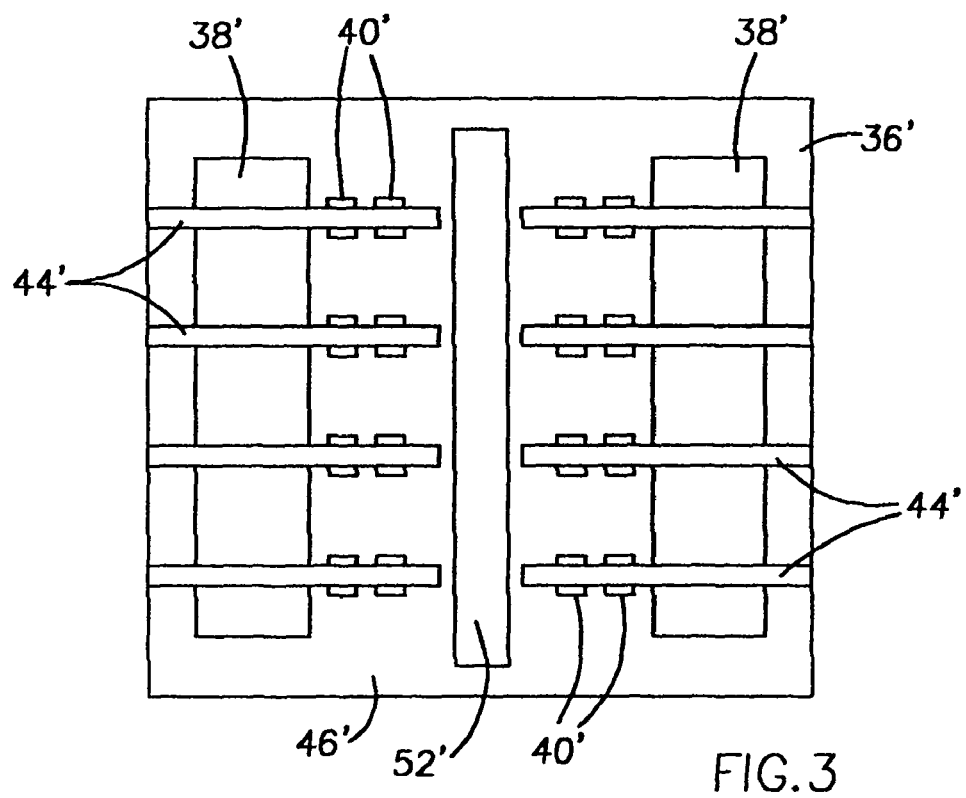
FIG. 3 is a bottom plan view of the flexible film interposer of FIG. 2.
Figure 3A:
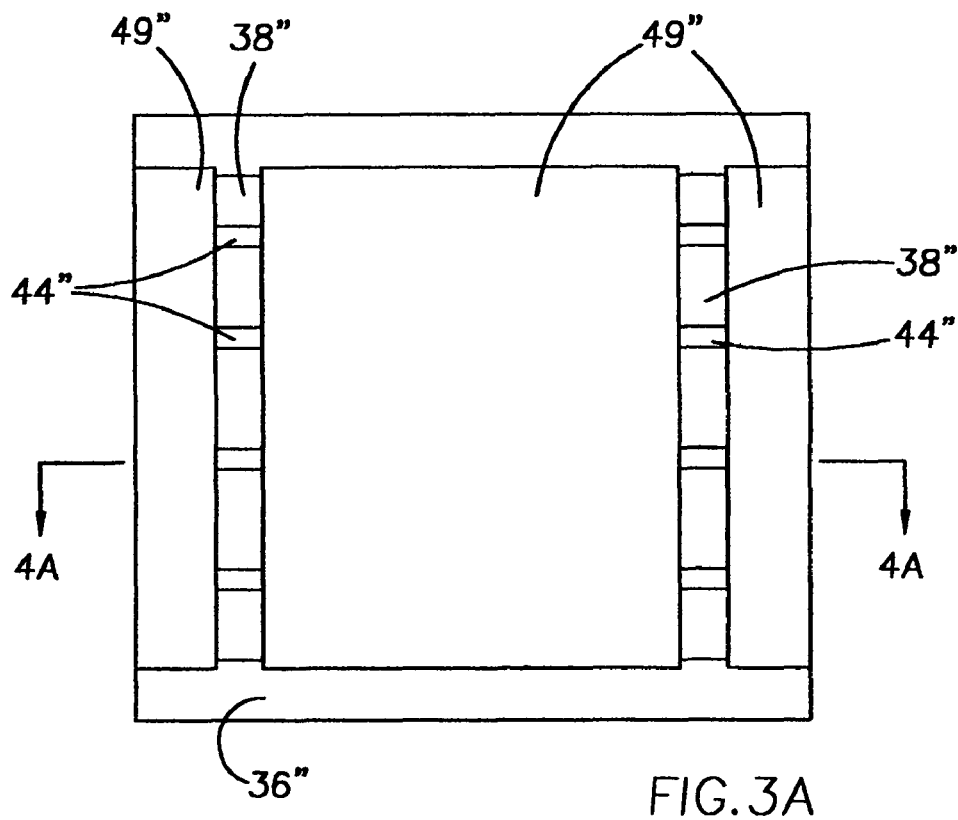
FIG. 3A is a bottom plan view of an embodiment of the interposer of FIG. 2, having a soldermask layer disposed over the traces.
Figure 4A:
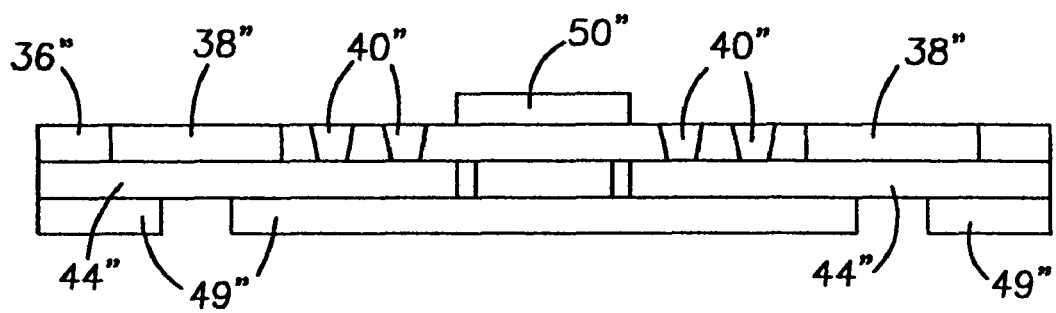
FIG. 4A is a cross-sectional, side elevational view of the interposer depicted in FIG. 3A, taken along line 4A-4A.
Figure 4:
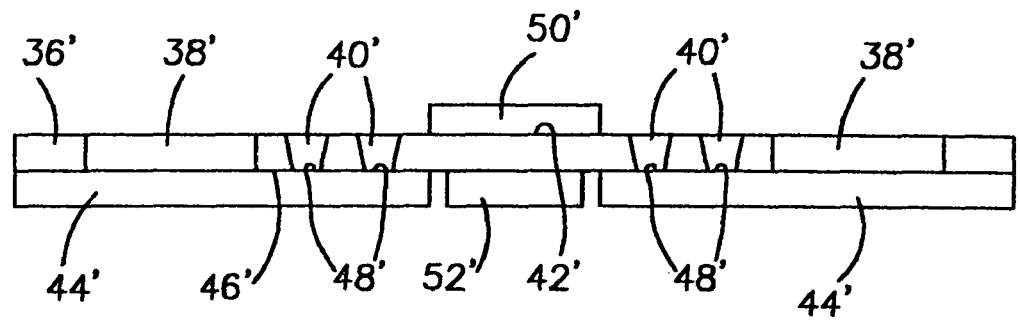
FIG. 4 is a cross-sectional, side elevational view of the flexible film interposer of FIG. 2, taken along line 4-4.

Referring to FIGS. 2-4, an embodiment of a flexible film interposer 36' according to the invention is depicted in a simplified top plan view. The flexible film interposer 36' can be formed from known insulating polymeric materials, for example, a flex tape. In preferred implementations, the interposer 36' comprises a flexible polyimide film (e.g., KAPTON from DuPont, Wilmington, Del., or UPILEX from Ube Industries, Ltd., Japan) having a thickness in the range of about 12.5 µm to about 200 µm, with thicknesses in the range of about 12.5 µm to about 50 µm being preferred.

According to the invention, the flexible film interposer 36' comprises slots or recesses 38' to facilitate a first level interconnection to the bottom die (not shown) by means of TAB or conventional wire bonding. The interposer 36' also includes multiple recesses or vias 40' for first level interconnection of the top die in a flip chip attachment.

The recesses 38', 40' can be formed through a first (upper) surface 42' of the flexible film interposer 36' by a method known in the art and appropriate to the material employed for the flexible film interposer 36', for example, patterning and utilizing a chemical wet etch or dry etch, mechanical drilling or punching, and laser ablation.

Each of the recesses 38', 40' extend to a bond pad 44' in the form of a conductive trace formed on the second (lower) surface 46' of the interposer 36'. Such traces 44' can be formed by etching a conductive layer disposed on the lower surface 46' of the interposer, or by printing traces onto the lower surface using conductive ink. Preferably, traces 44' comprising copper or a copper alloy are utilized.

As shown in a bottom plan view in FIG. 3, the recesses 38' are depicted in the form of a slot with the traces 44' extending thereover. The recesses (slots) 38' are sized and configured to adequately receive therethrough a conventional bonding tool for tape automated bonding (TAB) or wire bonding, typically with a width of about 50 µm to about 2 mm. The recesses 38' can be formed in any suitable shape, such as square, rectangular, oval, and circular, and may include tapered side walls.

The multiple recesses (vias) 40' are formed in the flexible film interposer 36' in a preselected pattern and having a predetermined size and shape to correspond with a bond pad configuration formed on an active surface of a semiconductor die intended to be attached thereto. The recesses 40' can be formed with tapered sidewalls (FIG. 4) or straight (vertically oriented) sidewalls (FIG. 5A), as desired. The conductive traces (bond pads) 44' extend over each of the recesses 40' at the base 48' thereof. Optionally, as shown in FIGS. 3A-4A, a soldermask layer 49" can be formed over the traces 44' to provide an overlying insulation layer. Typically, the soldermask comprises a photoimageable dielectric material that can be blanket deposited as a wet or dry film, exposed through a mask, developed and then cured.

The spaced apart recesses 40' are formed in the flexible film interposer 36' in a preselected pattern to correspond with the bond pads and bump configuration of the die (flip chip) to be attached to the interposer 36'. For example, FIG. 2 depicts the multiple recesses 40' in a centrally positioned, four-row configuration in the flexible film interposer 36'. Such configuration is made to correspond and receive bumps of a bumped semiconductor die (flip chip) having, for example, centrally positioned, four-row bump configuration which will be more fully illustrated and described hereafter. Other patterns of the multiple recesses (vias) 40' can also be utilized to match with a particular bump configuration. For example, FIGS. 5A-5B illustrate another embodiment of an interposer 36", 36'" having a centrally located single row of recesses 40", 40'" to correspond with a single row of conductive bumps 60″, 60‴ on the die 54″, 54‴. In addition, the multiple recesses 40′ can be formed in any suitable shape including, for example, square, rectangular, oval, and circular, and can include tapered side walls as shown, such that the openings of the recesses 40′ are larger than the bases.

Optionally, an adhesive element 50′, 52′ can be disposed, respectively, on the first (upper) surface 42′ and/or the second (lower) surface 46′ of the flexible film interposer 36′. The adhesive elements 50′, 52′ can be utilized to secure a top (flip chip) die and a bottom die, respectively, to the flexible film interposer 36′. The adhesive elements 50′, 52′ can comprise any suitable adhesive material known in the art, including contact adhesives, thermoplastic adhesives and thermosetting adhesives, for example, an adhesive gel or paste such as a conventional epoxy or polyimide die bonding adhesive, and/or a double-sided adhesive tape such as polyimide. Adhesive element 50′ can have a thickness such that it functions as a spacer to control the degree of insertion of conductive bumps carried on the top die into recesses 40′. Although not shown, adhesive element 52′ can extend onto the traces 44′. The flexible film interposer 36′ can be provided in a pre-taped form with an adhesive tape attached thereto, or the adhesive elements 50′, 52′ can be applied to the flexible film interposer 36′ during fabrication of a stacked die assembly or package. In another embodiment (not shown), the adhesive elements 50′, 52′ can be applied to the active surfaces of the semiconductor die to be attached to the flexible film interposer 36′. Many suitable adhesive application methods for liquid or gel adhesive application are known in the art, such as screen printing, roller applicator, spray, and transfer. Similarly, an adhesive tape may be applied from a dispenser and severed from a roll of tape, or applied from a transfer (carrier) film.

FIGS. 5-11 illustrate an embodiment of a method of forming a stacked die package according to the invention utilizing the flexible film interposer 36′.

Figure 5:
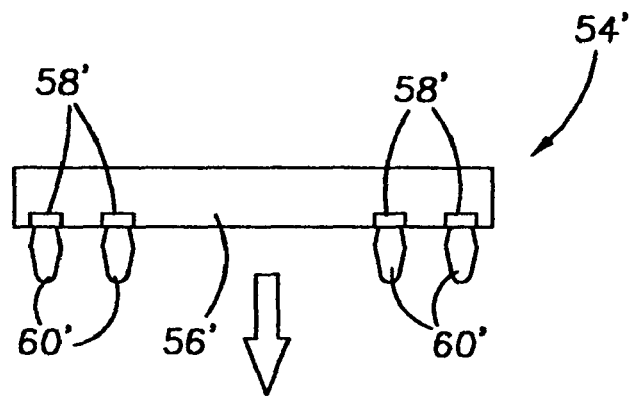
FIGS. 5-11 illustrates sequential processing steps showing fabrication of a stacked die package according to an embodiment of a method of the invention.
Figure 5:
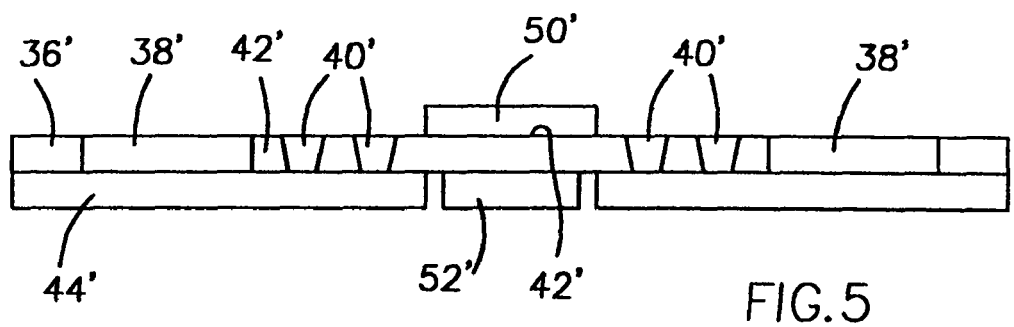
Figure 5A:
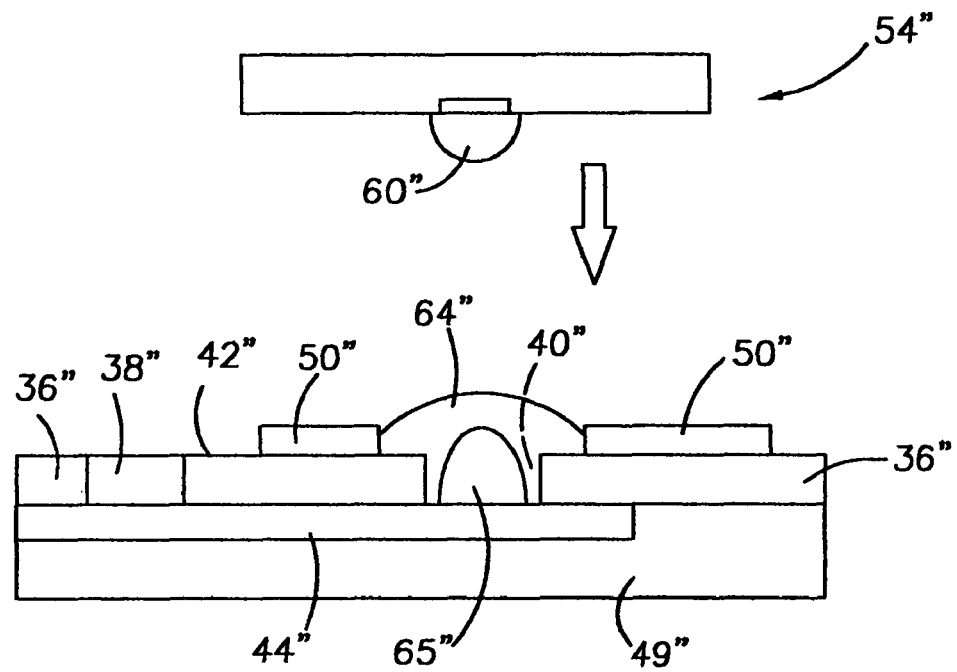
FIGS. 5A-5B illustrate other embodiments of the step of mounting a flip chip onto an interposer, the embodiment of the flip chip die having a single row of bumps and the interposer having a corresponding row of recesses.
Figure 5B:
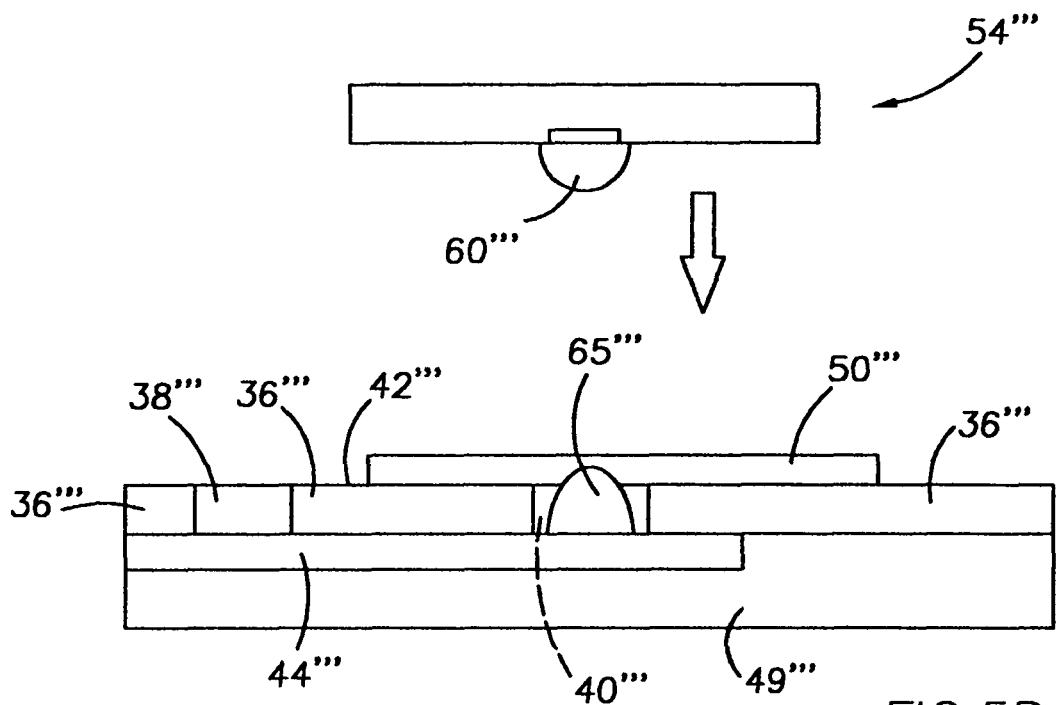
Figure 6:
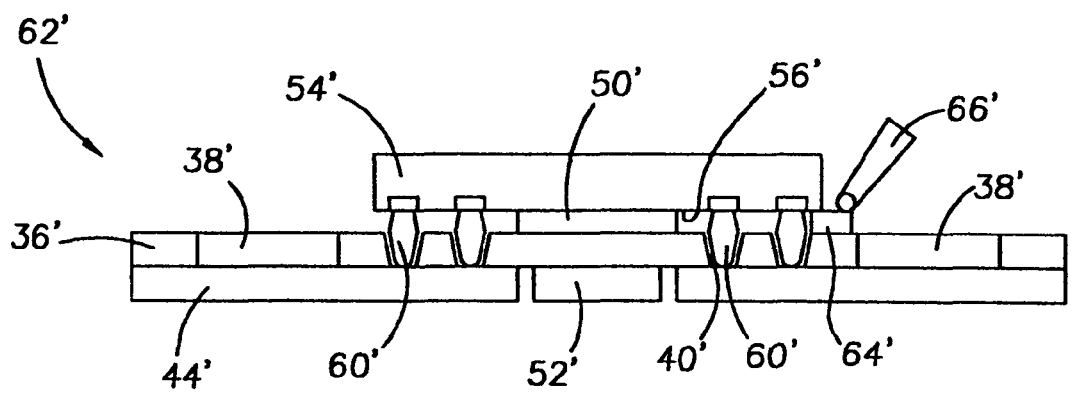
Figure 7:
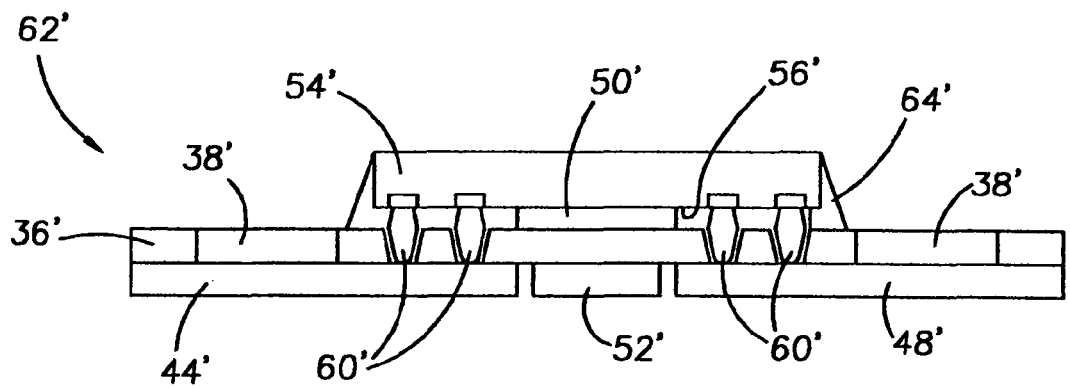

FIGS. 5-7 depicts simplified cross-sectional views of the mounting and bonding of the flexible film interposer 36′ to a semiconductor die 54′ in a flip chip attachment. As shown in FIG. 5, the first (upper) surface 42′ of the flexible film interposer 36′ is aligned with and facing the active surface 56′ of the die 54′ prior to assembly. The active surface 56′ includes a plurality of bond pads 58′ with conductive bumps 60′ mounted thereon, which are arranged in a predetermined configuration. Recesses 40′ in the flexible film interposer 36′ are sized and configured to correspond to the configuration of the bond pads 58′ and the conductive bumps 60′. The conductive bumps 60′ typically comprise a metal or alloy such as copper, silver or gold, or a conductive polymer material, and can be formed by known methods in the art, for example, electroplating, metal stud bumping by wire bonders, and stenciling.

FIG. 6 shows the flexible film interposer 36′ mounted to the die 54′ in a flip chip attachment to form a die/interposer assembly 62′, whereby each of the conductive bumps 60′ is inserted into a corresponding recess 40′ of interposer 36′ and engage with the traces (bond pads) 44′ at the base 48′ of each of the recesses 40′. The die 54′ can be attached to the flexible film interposer 36′ by the optional adhesive element 50′ (e.g., tape, non-conductive die attach paste) disposed on the first (upper) surface of the flexible film interposer 36′, or on the active surface 56′ of the die 54′. The conductive bumps 60′ in the form of solder bumps can be reflowed to fill the recesses (vias) 40′ and physically and electrically bond with the traces (bond pads) 44′, or cured in the case of conductive polymer bumps, although other methods such as thermal compression can also be used. The conductive bumps 60′ can also be connected to the traces (bond pads) 44′ by means of a conductive paste (not shown) such as a eutectic solder or conductive epoxy, that is applied onto the bumps 60′ or into the recesses 40′ to provide electrical contact between the bumps 60′ and the traces 44′, with the bumps 60′ then reflowed or cured.

As depicted in FIGS. 6-7, a dielectric underfill encapsulation material 64′ as known in the art, such as an epoxy or silicone compound, can be applied between the active die surface 56′ and the upper surface 42′ of the flexible film interposer 36′ to reinforce the connection between the die 54′ to the flexible film interposer 36′ and protect the bump connections from contamination. Preferably, the underfill material 64′ is applied by capillary action under pressure, using a dispensing needle 66′ as known in the art, whereby the fill material is dispensed around the perimeter of the die 54′ and allowed to flow beneath the die to fill the space between the active surface 56′ of the die and the upper surface 42′ of the interposer 36′. Other known methods of underfilling include gravity and vacuum injecting the underfill material. The dielectric material can be cured through a chemical reaction, or by the application of UV light or other radiation and/or heat.

Instead of utilizing the above-described underfill process (FIGS. 6-7), a non-flow underfill material can be deposited into the recesses of the flexible film interposer 36′ and the flip chip die 54′ mounted thereon. For example, as shown in FIG. 5A, a non-flowable underfill material 64″ such as a thermoset or thermoplastic polymer, typically in paste form, can be deposited into the recess 40″ of the interposer 36″, and the flip chip die 54″ can then be die mounted onto the interposer 36″ with the conductive bumps 60″ inserted into underfill 64″ in the recesses 40″, optionally, with the additional use of a tape adhesive 50″ (and/or paste adhesive as desired) applied to the surface 42″ of the interposer. In the embodiment of the interposer 36″ shown in FIG. 5A, a conductive bump 65″ can be optionally disposed in the recess 40″ over the traces 44″ to facilitate electrical contact between the bumps 60″ of the flip chip die 54″ with the traces 44″. FIG. 5A also illustrates an embodiment of a flip chip die 54″ having a single row of conductive bumps 60″ and an interposer 36″ having recesses 40″ in a corresponding single row.

In another embodiment, as shown in FIG. 5B, a non-conductive film and/or paste (e.g., NCF film) 50‴ can be applied over the upper surface 42‴ of the interposer 36‴, and the flip chip die 54‴ then die mounted onto the interposer 36‴. The film and/or paste 50‴ allows the conductive bumps 60‴ of the flip chip die to penetrate therethrough. Optionally, a non-flowable underfill material can be deposited in the recesses 40‴ of the interposer 36‴ prior to applying the film and/or paste 50‴. Similar to FIG. 5A, conductive bumps 65‴ are disposed within the recesses 40‴ for contact between the bumps 60‴ on the flip chip 54‴ and the traces 44‴.

Figure 8:
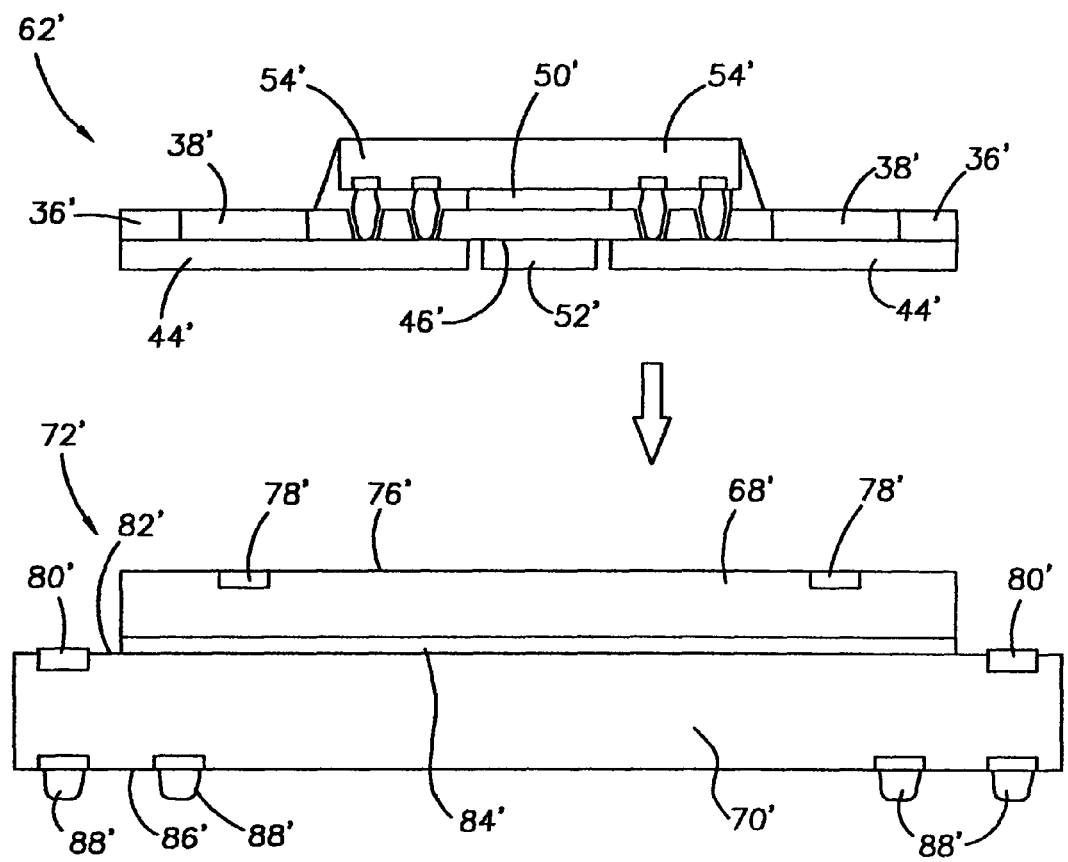

The flexible film interposer and top die assembly 62′ is then mounted onto a second (lower) die 68′ that has been mounted onto an interposer substrate 70′ in a chip-on-board (COB) assembly 72′ to form the stacked die assembly 74′. As shown in FIG. 8, the second (lower) surface 46′ of the flexible film interposer 36′ is aligned with and facing the active surface 76′ of the second (lower) die 68′ prior to assembly. The interposer/top die assembly 62′ and the COB assembly 72′ can be bonded together using techniques known and used in the art, such as by tape adhesive and/or epoxy adhesive, and the like.

A conventional assembly process can used to prepare the COB assembly 72′. As shown, an active surface 76′ of the second die 68′ includes bond pads 78′ along the periphery thereof. The interposer substrate 70′ includes terminal pads

80' on the first (upper) surface 82'. The die 68' has been surface mounted onto the first (upper) surface 82' of the interposer substrate 70' by means of an adhesive element 84', which can comprise any suitable dielectric adhesive known in the art, and be of any suitable form, for example, with a tape adhesive or die attach paste, as described with respect to adhesive elements 50', 52'.

Figure 9:
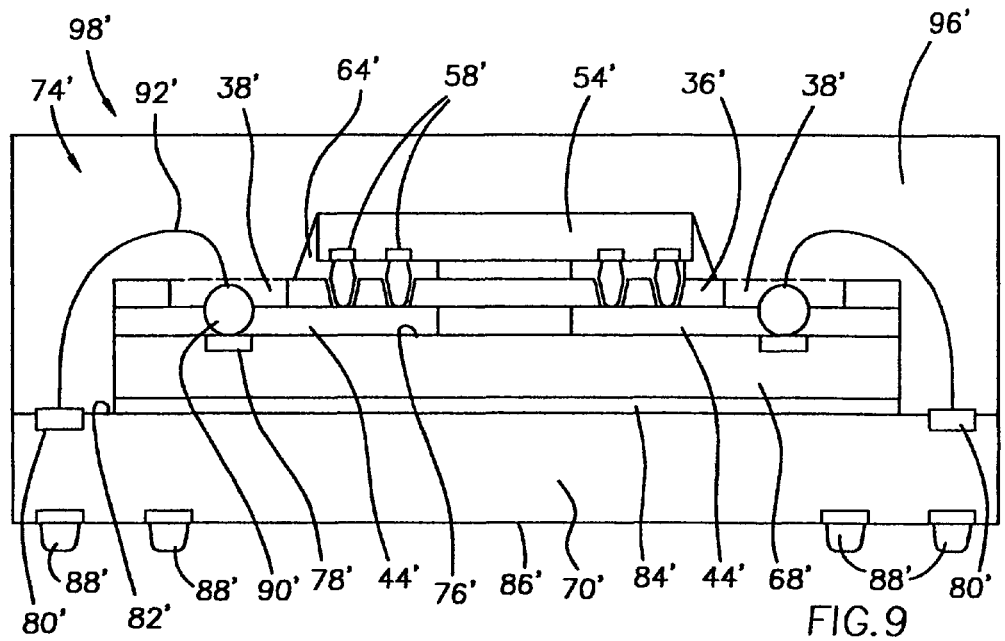

In the illustrated embodiment in FIG. 9, the interposer substrate 70' is structured to couple the chip package 98' (FIG. 9) as a component to an electrical apparatus such as a PCB or other external circuitry (not shown) such as a motherboard of a computer, program logic controller (PLC), a testing apparatus, among others. Typical interposers 70' for coupling semiconductive devices to an electrical apparatus are comprised of a flexible laminated polymer or polyimide layer, or a non-flexible material such as a bismaleimide triazine (BT) resin, FR4 fiberglass laminate, FR5 laminate, or ceramic. Such interposer substrates 70' typically includes a variety of conductive vias (not shown) that extend through the cross-section of the substrate and establish routing of the conductive elements through the substrate 70', and further include electrically conductive metal lines or traces and pads formed on the second (bottom) surface 86' for electrical connection to an external electrical apparatus (not shown). External contacts 88' in the form of conductive solder balls (or other suitable conductive material such as conductive epoxies or conductor-filled epoxies), columns, pins, and the like, are used to connect the pads on the bottom surface 86' of the interposer substrate 70' to the electrical apparatus.

In another embodiment, the interposer substrate 70' can comprise a PCB substrate, motherboard, or other like substrate, whereby the top die/interposer assembly 62' and bottom die 68' are mounted directly thereon, and external contacts 88' are omitted. This structure functions as a board level device such as a module or a motherboard.

Referring to FIG. 8, in mounting the assemblies 62', 72', the traces (bond pads) 44' in the recesses 38' are aligned with corresponding bond pads 78' of the bottom die 68'. Conventional assembly devices such as aligner bonder tools (e.g., LOC mounter) can be used to align and then bond the bottom die 68' to the flexible film interposer 36'. A split optics system can also be used to view aligned portions of the die and the substrate.

Figure 10:
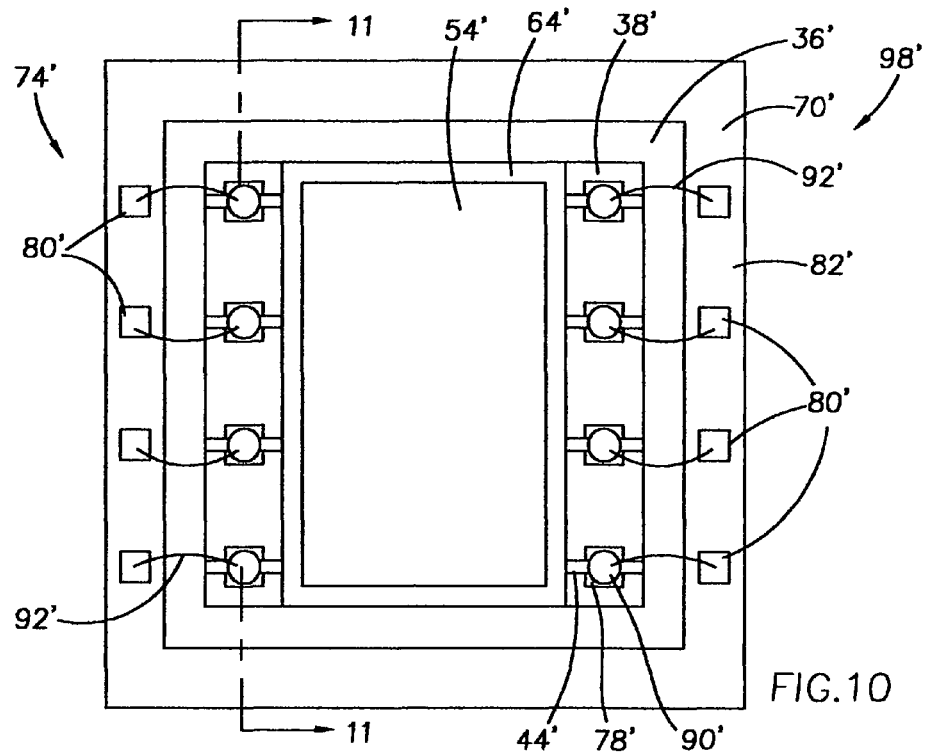

FIGS. 9-10 depict the assemblies 62', 72' mounted to form a stacked die assembly 74'. Wire bonding or TAB bonding is performed to join the traces (bond pads) 44' to the bond pads 78' of the bottom die 68', and to the terminal pads 80' on the interposer substrate 70'. The recesses 38' are sized to permit access for a bonding tool such as a wire bond capillary (not shown), to the bond pads 78' of the bottom die 68'. The bonding tool can be configured, for example, for thermosonically bonding, thermocompression bonding, tape-automated bonding (TAB), or other method known in the art.

Figure 11:
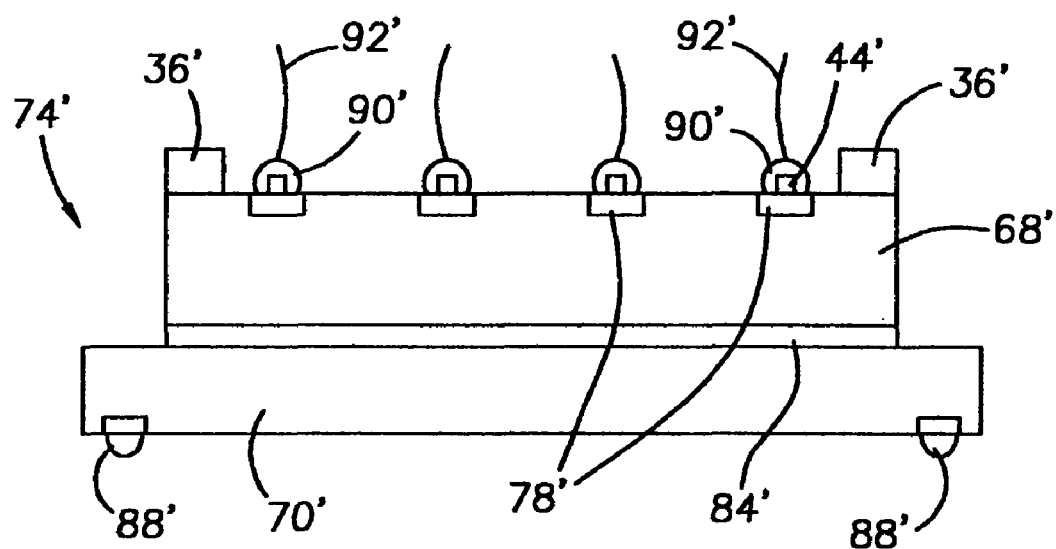

In the illustrated example in FIG. 9, thermosonic bonding with a ball bond 90' is used. Ball bonds 90' are formed in the recesses 38' over the traces (bond pads) 44' and the bond pads 78' of the bottom die 68', thus joining the traces 44' and the bond pads 78' together in one operation, as best seen in FIG. 11. The bond wires 92' are extended and bonded to the terminal pads 80' on the interposer substrate 70'. The ball bonds 90' function to bond together the flexible film interposer 38', the bottom die 68' and the interposer substrate 70'. In other embodiments, TAB bonding and ultrasonic bonding, as known and used in the art, can be used to connect the traces 44" and the bond pads 78".

Referring again to FIG. 9, the wire-bonded stacked die assembly 82' can be partially or fully encapsulated with a dielectric encapsulation material 96' using known techniques in the art to form an encapsulated stacked die package 98', for example, by spin-coating, glob-top, pot molding, and transfer molding.

Figure 12:
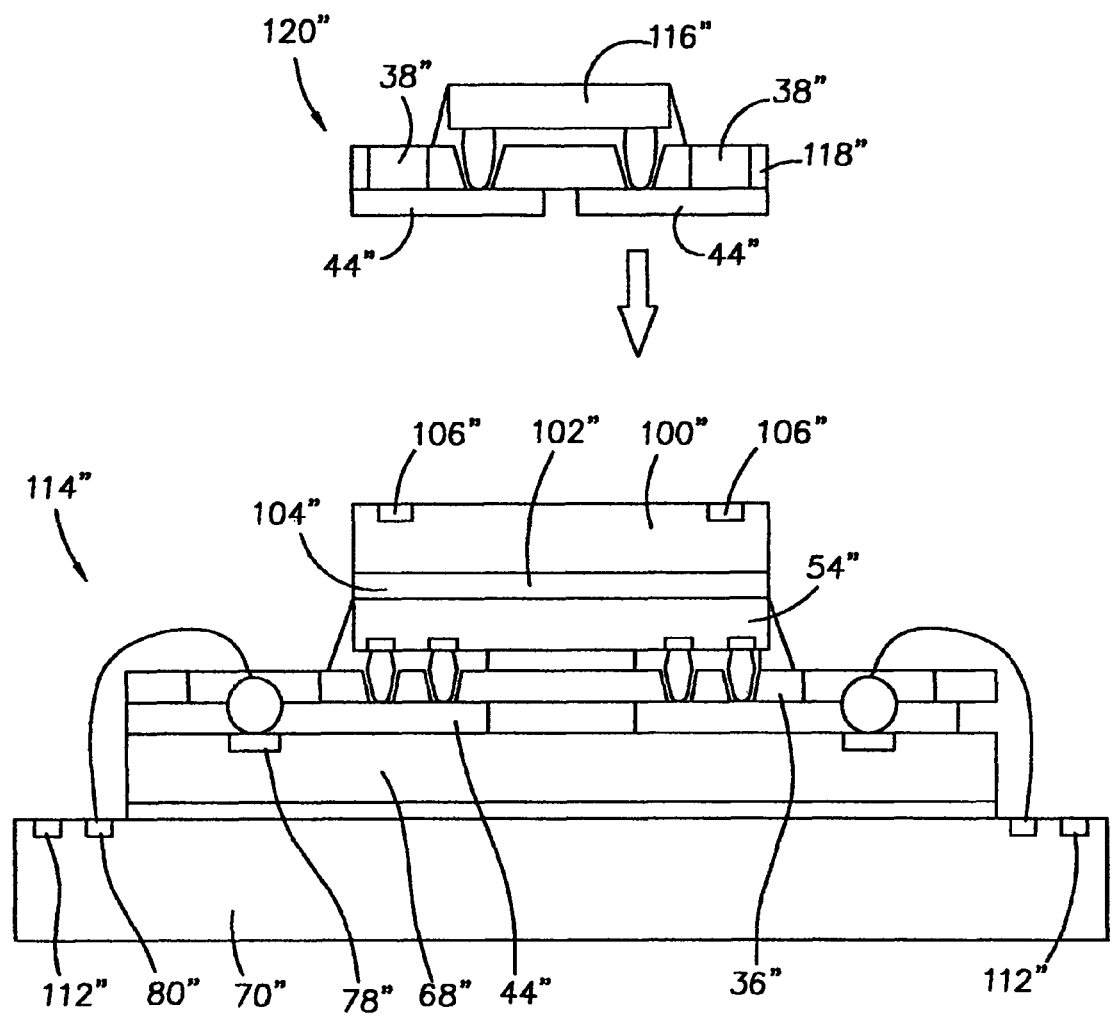
FIG. 12 is a cross-sectional, side elevational view of a second embodiment of a stacked die package fabricated according to the invention.

The method can be utilized to fabricate an assembly comprising additional stacked die layers, such as the embodiment depicted in FIG. 12. As shown, a semiconductor die 100" has been surface mounted by means of an adhesive element 102" onto the second (inactive) surface 104" of the die (flip chip) 54". Additional die 116" mounted on a flexible film interposer 118" having recesses 38" (assembly 120") can be mounted on the die 100" and bonded to the interposer 70" as described hereinabove. Bond pads 106" can then be bonded as described previously to terminal pads 112" on the interposer substrate 70". Further dies can be added to the stacked die assembly by alternating a surface mounted die (100") and a flip chip/flexible film interposer assembly (120").

Figure 1:
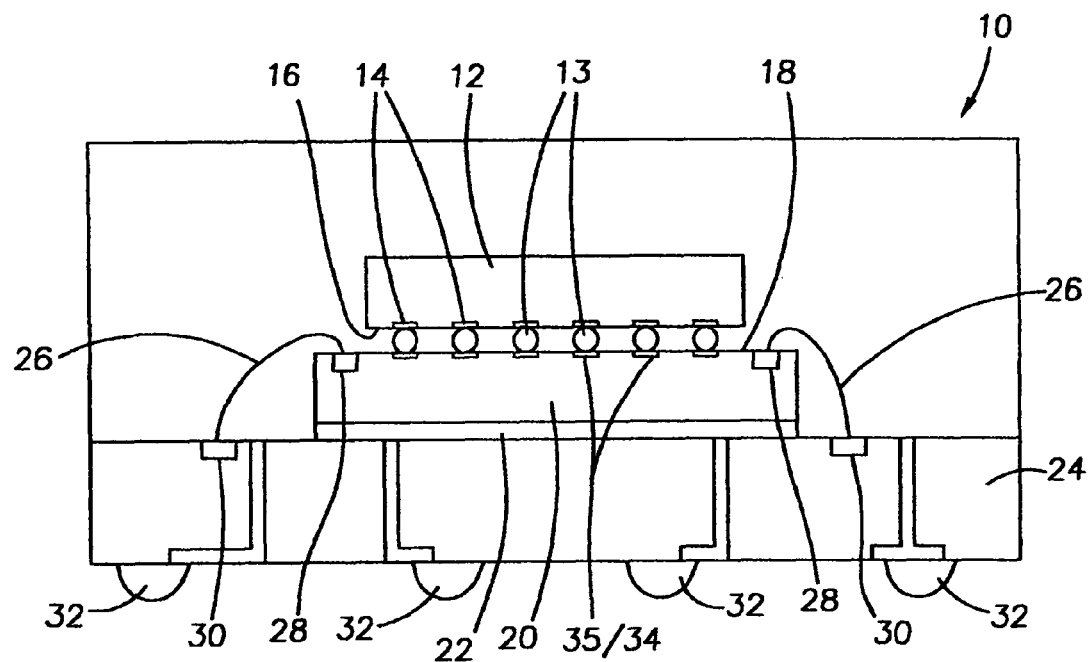
FIG. 1 is a cross-sectional, side elevational view of a prior art embodiment of a stacked die package comprising a flip chip mounted on an RDL on a chip-on-board.
Figure 1A:
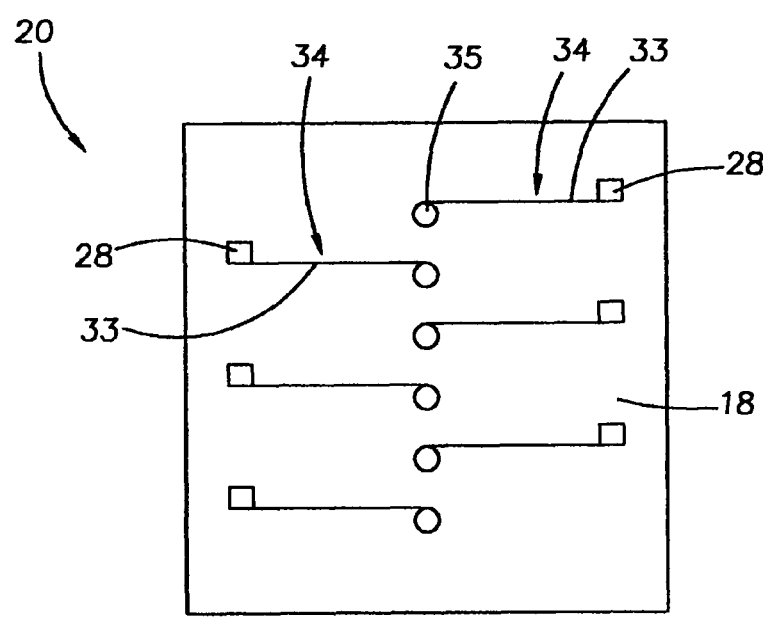
FIG. 1A is a top plan view of an embodiment of the bottom die of FIG. 1 (with the top die removed), illustrating an RDL.

The flexible film interposer of the invention functions to redistribute and connect the bond pads of the bottom die to bond pads of the upper (flip chip) die, advantageously replacing the RDL (34) required in a conventional flip chip attachment, as in FIG. 1, and at less cost than a conventional RDL. In addition, the design of the flexible film interposer including the relatively large size of the recesses (vias) provides improved accuracy with mounting the upper (flip chip) die to the bottom die, being readily achievable using a conventional die mounting device. Further, the recesses (slots) are sized to readily receive a bonding tool therethrough to bond the traces and bond pads on the bottom die to an interposer carrier substrate in one operation.

In addition, the present package achieves a desirably low package profile. The package design also utilizes conventional underfill processes that are carried out on the surface of the flexible interposer substrate rather than the active surface of the bottom die, thus reducing yield and process difficulties.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A die assembly, comprising:
   an interposer for mounting a die thereon, comprising a recess and a slot extending through a flexible substrate from a first surface to a second surface, the recess having a width and sized for receiving a conductive bump of a die therein, and a trace on the second surface of the substrate extending across the slot and the width of the recess;
   a first die on the first surface of the substrate with a conductive bump of said first die situated in the recess of the substrate and in contact with the trace extending across the recess, the first die not covering the slot; and
   a second die on the second surface of the substrate with a bond pad of said second die vertically aligned with the slot and in contact with the trace extending across the slot.

2. A die assembly, comprising:
   an interposer for mounting a die thereon, comprising a plurality of recesses and a slot extending through a flexible substrate from a first surface to a second surface, each recess having a width and sized to receive a conductive bump of a die therein, and a plurality of traces on the second surface of the substrate, each trace extending across the slot and the width of a recess, the plurality of recesses in an array corresponding to the conductive bumps of the die and the slot situated adjacent to said array of recesses;

a first die on the first surface of the substrate with a conductive bump of said first die situated in a recess of the substrate and in contact with the trace extending across the recess, the first die not covering the slot; and a second die on the second surface of the substrate with bond pads of said second die vertically aligned with the slot and in contact with the traces extending across the slot.

3. The interposer of claim 2, further comprising a second slot, said slots situated at opposing sides of the interposer with the plurality of recesses situated therebetween.

4. A die assembly, comprising:

an interposer for mounting a die thereon, comprising a plurality of recesses and a slot extending through a flexible substrate from a first surface to a second surface, the recesses having a width and sized to receive a single conductive bump of a die and in an array corresponding to a plurality of conductive bumps for a flip-chip attachment of the die, the slot situated adjacent to said array of recesses, and a plurality of traces on the second surface of the substrate, each trace extending across the slot and the width of a recess;

a first die flip chip mounted on the first surface of the substrate with a conductive bump of said first die situated in the recess of the substrate and in contact with the trace extending across the recess, the first die not covering the slot; and a second die on the second surface of the substrate with bond pads of said second die vertically aligned with the slot and in contact with the traces extending across the slot.

5. A die assembly, comprising:

an interposer for mounting a die thereon, comprising a plurality of recesses and a slot extending through a flexible substrate from a first surface to a second surface, each recess having a width and sized for receiving a single conductive bump of a die therein, the recesses in an array suitable for flip-chip mounting an array of the conductive bumps on the die, a plurality of traces on the second surface of the substrate, each trace extending across the slot and the width of a recess, and the slot situated adjacent to said array of recesses;

a first die flip chip mounted on the first surface of the substrate with a conductive bump of said first die situated in a recess of the substrate and in contact with the trace extending across the recess, the first die not covering the slot; and a second die on the second surface of the substrate with bond pads of said second die vertically aligned with the slot and in contact with the traces extending across the slot.

6. A die assembly, comprising:

an interposer for mounting a die thereon, comprising a plurality of recesses and a slot extending through a flexible substrate from a first surface to a second surface, each recess having a width and sized for receiving a single conductive bump of a die therein and the slot situated adjacent the recesses, a conductive trace on the second surface of the interposer extending across the slot and the width of a recess;

a first die on the first surface of the substrate with a conductive bump of said first die situated in a recess of the substrate and in contact with the trace extending across the recess, the first die not covering the slot; and a second die on the second surface of the substrate with a bond pad of said second die vertically aligned with the slot and in contact with the trace extending across the slot.

7. A die assembly, comprising:

an interposer for mounting a die thereon, comprising a plurality of recesses and a slot extending through a flexible substrate from a first surface to a second surface, each recess having a width and sized for receiving a conductive bump of a die therein, a plurality of traces on the second surface of the interposer, each recess with a trace extending across the width of the recess and the slot;

a first die on the first surface of the substrate with a conductive bump of said first die situated in a recess of the substrate and in contact with the trace extending across the recess, the first die not covering the slot; and a second die on the second surface of the substrate with bond pads of said second die vertically aligned with the slot and in contact with the traces extending across the slot;

wherein the second die is situated on the substrate opposite the first die in a vertically stacked arrangement.

8. A die assembly, comprising a first die on a flexible interposer, the interposer comprising a recess having a width and a slot extending therethrough from a first surface to a second surface, and a trace on the second surface of the interposer extending across the slot and the width of the recess, a conductive bump of the first die received in the recess of the interposer in contact with the trace extending across the recess, and the slot exposed adjacent to the first die, and a second die on the second surface of the interposer with a bond pad of said second die vertically aligned with the slot and in contact with the trace extending across the slot.

9. The assembly of claim 8, further comprising an encapsulation material in the recess over the conductive bump.

10. A die assembly, comprising a first die on a flexible interposer, the interposer comprising a plurality of recesses and a slot extending therethrough from a first surface to a second surface, each recess having a width, a plurality of traces on the second surface of the interposer, each trace extending across the slot and the width of a recess, conductive bumps on a surface of the first die situated in the recesses of the interposer in contact with a trace extending across the recess, and the slot exposed adjacent to the first die, and a second die on the second surface of the interposer with bond pads of said second die vertically aligned with the slot and in contact with the traces extending across the slot.

11. The assembly of claim 10, further comprising an encapsulation material between the first die and the interposer.

12. A die assembly, comprising a first die on a first surface of a flexible interposer, the flexible interposer comprising a plurality of recesses and a slot extending therethrough from a first surface to a second surface, each recess having a width and sized for receiving a single conductive bump of the first die therein, conductive bumps on a surface of the first die situated in the recesses of the flexible interposer and the slot exposed adjacent to the first die, and a plurality of traces on the second surface of the flexible interposer, each recess with a trace extending across the width of the recess and across the slot, and each conductive bump in contact with said trace extending across the recess, and a second die on the second surface of the flexible interposer with bond pads of said second die vertically aligned with the slot and in contact with the traces extending across the slot, the second die mounted on a second interposer.

13. The assembly of claim 12, wherein the conductive bumps are in contact with the traces within the recesses via a conductive material.

14. The assembly of claim 12, wherein the traces and the bond pads of the second die are connected.

15. The assembly of claim 12, a wherein the second interposer comprises a non-flexible material selected from the group consisting of a bismaleimide triazine (BT) resin, fiberglass laminate, FR5 laminate, and ceramic.

16. The assembly of claim 15, wherein the traces and the bond pads of the second die are connected to terminal pads on the second interposer.

17. The assembly of claim 16, wherein the traces and the bond pads of the second die are connected by a ball bond wire bonded to the terminal pads.

18. The assembly of claim 16, wherein the traces and the bond pads of the second die are connected to the terminal pads by a TAB bond.

19. The assembly of claim 15, wherein the second interposer comprises contacts for coupling the assembly to external circuitry.

20. A die package, comprising a die assembly comprising:
a die on a first surface of a flexible interposer, the interposer comprising a plurality of recesses and a slot extending therethrough from a first surface to a second surface, each recess having a width and sized for receiving a single conductive bump of a die therein, conductive bumps on a surface of the die situated in the recesses of the interposer and the slot exposed adjacent to the die, and a plurality of traces on the second surface of the interposer, each recess with a trace extending across the width of the recess and the slot, and each conductive bump in contact with said trace within the recess; and
a second die on the second surface of the flexible interposer with bond pads of the second die exposed through the slot;
wherein the traces and the bond pads of the second die are connected.

21. An apparatus, comprising an electrical apparatus in electrical communication with a die package comprising:
a die on a first surface of a flexible interposer, the interposer comprising a plurality of recesses and a slot extending therethrough from a first surface to a second surface, each recess having a width and sized for receiving a single conductive bump of a die therein, conductive bumps on a surface of the die situated in the recesses of the interposer and the slot exposed adjacent to the die, and a plurality of traces on the second surface of the interposer, each recess with a trace extending across the width of the recess and across the slot, and each conductive bump in contact with said trace within the recess; and
a second die on the second surface of the flexible interposer with bond pads of the second die exposed through the slot;
wherein the traces and the bond pads of the second die are connected.

22. The apparatus of claim 21, wherein the electrical apparatus is selected from the group consisting of a motherboard, a program logic controller, and a testing apparatus.

23. A method of fabricating a stacked die assembly, comprising:
forming an interposer by forming a plurality of recesses and a slot extending through a flexible substrate from a first surface to a second surface, the slot situated adjacent the plurality of recesses, and each of the recesses sized to receive a single conductive contact of a die therein;
forming conductive traces on the second surface of the substrate such that a trace extends across the width of each recess and the slot;
flip chip mounting a first die on a first surface of the substrate such that conductive bumps on the first die are situated within said recesses of the interposer in contact with the traces extending across the recesses and the slot is exposed adjacent to the first die; and
mounting a second die on the second surface of the interposer opposite the first die in a vertically stacked arrangement and with bond pads of the second die vertically aligned with the slot and in contact with the traces extending across the slot.

24. A method of fabricating a stacked die assembly, comprising:
mounting a first die on a first surface of a flexible interposer such that each of a plurality of conductive bumps on the surface of the first die is situated within a recess extending through the interposer from the first surface to a second surface, a slot extending through the interposer is exposed adjacent to the first die, and traces on the second surface of the interposer extend across the width of each recess and are in contact with the conductive bumps of the first die situated within the recesses of the interposer wherein a trace in contact with a bump extends across the slot and is exposed within the slot; and
mounting a second die on the second surface of the interposer opposite the first die in a vertically stacked arrangement and with bond pads of the second die vertically aligned with the slot and in contact with the traces extending across the slot.

25. The method of claim 24, wherein the method further comprises mounting the second die on a substrate such that terminal pads on the substrate are situated adjacent to the second die, and connecting the traces and the bond pads of the second die with the terminal pads on the substrate.

26. The method of claim 25, further comprising encapsulating at least a portion of the die assembly to form a package.

27. The method of claim 24, further comprising mounting the second die on a substrate.

28. The method of claim 27, wherein the substrate is structured to couple the die assembly to an electrical apparatus.

29. The method of claim 27, wherein the substrate comprises a flexible material.

30. The method of claim 27, wherein the substrate comprises a non-flexible material.

31. The method of claim 30, wherein the non-flexible material is selected from the group consisting of a bismaleimide triazine (BT) resin, fiberglass laminate, FR4 laminate, FR5 laminate and ceramic.

32. The method of claim 27, wherein the substrate is a PCB substrate or motherboard.

33. A method of fabricating a stacked die assembly, comprising:
mounting a first die on a first surface of a flexible interposer such that each of a plurality of conductive bumps on the surface of the first die is situated within a recess extending through the interposer from the first surface to a second surface, a slot extending through the interposer is exposed adjacent to the first die, and traces on the second surface of the interposer extend across the width of each recess and are in contact with the conductive bumps of the first die situated within the recesses of the interposer wherein a trace in contact with a bump extends to and is exposed within the slot;

mounting a second die on a substrate; and mounting the second die on the second surface of the interposer opposite the first die in a vertically stacked arrangement and with bond pads of the second die vertically aligned with the slot such that the bond pads are in contact with the traces extending across the slot.

* * * * *

UNITED STATES PATENT AND TRADEMARK OFFICE
CERTIFICATE OF CORRECTION

| | | |
|---|---|---|
| PATENT NO. | : 8,125,065 B2 | Page 1 of 1 |
| APPLICATION NO. | : 11/714072 | |
| DATED | : February 28, 2012 | |
| INVENTOR(S) | : Teck Kheng Lee | |

It is certified that error appears in the above-identified patent and that said Letters Patent is hereby corrected as shown below:

In column 13, line 9, in Claim 15, delete "a wherein" and insert -- wherein --, therefor.

Signed and Sealed this
Eighth Day of May, 2012

David J. Kappos
*Director of the United States Patent and Trademark Office*